United States Patent [19]
Wright et al.

[11] Patent Number: 5,491,700
[45] Date of Patent: Feb. 13, 1996

[54] METHOD AND APPARATUS FOR CODE ERROR CORRECTION USING AN ORDERED SYNDROME AND ERROR CORRECTION LOOKUP TABLE

[75] Inventors: David Wright, Utica, N.Y.; Neal K. Riedel, Encinitas, Calif.

[73] Assignee: Pacific Communication Sciences, Inc., San Diego, Calif.

[21] Appl. No.: 131,078

[22] Filed: Oct. 1, 1993

[51] Int. Cl.⁶ .................................................. H03M 13/00
[52] U.S. Cl. .......................................................... 371/37.8
[58] Field of Search ................................. 371/37.1, 37.8; 379/58, 61; 455/83, 84, 89

[56] References Cited

U.S. PATENT DOCUMENTS

| | | | |
|---|---|---|---|
| 4,020,461 | 4/1977 | Adams et al. | 371/37.1 |
| 4,107,652 | 8/1978 | Tanahashi et al. | 371/37.1 |
| 4,319,357 | 3/1982 | Bossen | 371/37.2 |
| 4,564,944 | 1/1986 | Arnold et al. | 371/37.8 |
| 4,716,524 | 12/1987 | Oxley et al. | 395/400 |
| 4,731,737 | 3/1988 | Witt et al. | 395/425 |
| 4,903,257 | 2/1990 | Takeda et al. | 370/29 |
| 5,259,003 | 11/1993 | Berger et al. | 375/38 |
| 5,276,686 | 1/1994 | Ito | 370/95.1 |
| 5,396,470 | 3/1995 | Storn | 365/230.01 |
| 5,414,704 | 5/1995 | Spinney | 370/60 |

*Primary Examiner*—Stephen M. Baker
*Attorney, Agent, or Firm*—Woodcock Washburn Kurtz Mackiewicz & Norris

[57] ABSTRACT

Methods and apparatus for digital cordless telephone systems are disclosed for detecting and correcting errors in received signals. Such methods and apparatus include providing a table of predetermined syndromes, wherein each of the predetermined syndromes has an associated error correction pattern. The table is formed by selecting from all possible syndromes that could be predetermined from the segment length of received digital data, those predetermined syndromes having error patterns for correcting a predetermined number of errors within the segment and arranging the predetermined syndromes in the table in accordance with a predetermined order, such as ascending or descending numerical order. Thereafter, a current syndrome is calculated for the received digital data and the predetermined syndrome contained in the table matching the current syndrome is located by using a predetermined search technique. Received digital data is corrected by retrieving the error correction pattern associated with the located predetermined syndrome and correcting the error in the received digital data in response to this error correction pattern.

23 Claims, 3 Drawing Sheets

METHOD AND APPARATUS FOR CODE ERROR CORRECTION USING AN ORDERED SYNDROME AND ERROR CORRECTION LOOKUP TABLE

FIELD OF THE INVENTION

The present invention relates generally to error correction schemes used in connection with data encoded using any block code scheme and more particularly to error correction of cyclic redundancy coded information.

BACKGROUND OF THE INVENTION

For purposes of discussion herein, the invention is described in relation to its use or incorporation in a digital cordless telephone. However, it should be understood that the invention is not so limited, but will find use in many other applications using block coded data.

Presently, the design of cordless telephone systems is based primarily upon techniques for generating a speech representative signal using analog techniques and for transmitting the analog formed signal in accordance with known radio transmission techniques. It will be appreciated that analog techniques for generating speech representative signals are susceptible to interference and noise. Next generation cordless telephones will undoubtedly incorporate digital techniques for generating the speech representative signal, which digital signal would then be converted into analog form for transmission. Such next generation phones have been referred to as digital cordless telephones (DCT) or Personal Hand-Phones (PHP).

Since digital techniques effectively reduce speech representative signals to a series of numbers, the generated and reproduced speech signals would be more reliable, i.e., have less interference and noise, than the analog based speech signals produced in presently available cordless telephone systems. Indeed, digital techniques for generating speech or voice representative signals are now known for use in relation to cord-based telephone systems.

As used herein, cordless telephone or digital cordless telephone (DCT) refers to those systems intended for home, public or office use. Such systems typically include a battery powered portable station (handset) and a base station, with the base station being connected into the public telecommunication network.

Transmission standards or specifications have already been developed in both Japan and Europe for use in designing DCT systems. Each of the transmission standards are based on the use of a time division duplex (TDD) format, employing time division duplex for two-way communication. For purposes of illustration herein, the Japanese standards will be emphasized. However, it is noted that the invention will have utility with any transmission standard and is therefore not limited to use solely with the Japanese standard.

The Japanese DCT transmission standard specifies the use of a plurality of individual carrier signals having a frequency separation of 300 kHz within an overall system bandwidth of about 23 MHz between approximately 1,895 MHz to 1,918 MHz. Each carrier signal should support four channels in a TDMA format employing time division duplex for two-way communication. In particular, for each frame of time (5 ms) there are four transmit time slots (one for each channel) and four receive time slots (one for each channel). Each slot is approximately 625 µs long with a guard time of approximately 30 µs provided within each slot.

Under the Japanese standard, speech, representative signals are to be generated using a known digital technique, namely, the adaptive pulse code modulation (ADPCM) technique. The ADPCM signal is thereafter used to generate a digital modulated signal. The modulation scheme specified in the Japanese standard is the differential $\pi/4$-QPSK ($\pi/4$-quadrature phase shift keying) scheme with square root raised cosine filtering. It will be appreciated that such a scheme permits the transmission of digital data (1s and 0s) using a minimum number of bits. Digital data generated by this scheme is to be transmitted at a rate of 384 kHz which, in view of the modulation scheme, corresponds to a symbol transmission rate of 192 kHz. For a more detailed explanation of the differential $\pi/4$-QPSK modulation scheme, reference is made to application Ser. No. 999,210, filed Dec. 31, 1992 now U.S. Pat. No. 5,376,894.

By contrast, the European DCT system specifies a series of carriers spaced 1.728 MHz apart within an overall bandwidth of approximately 17.28 MHz. Each carrier is to support twelve full duplex channels, i.e., 12 slots for transmission and 12 slots for reception.

Unfortunately, the specification of particular transmission standards is only the beginning. Having established the particular parameters in which digital cordless telephone operation can occur, several technical problems arise in relation to the design and selection of components to be used for generation, transmission and reception of speech representative signals. These problems will require resolution in order to achieve the development of digital telephone equipment capable of operation within the parameters of such standards.

One such problem results from the requirement specified in the Japanese and European systems for error detection and correction (EDC). Although EDC is well known, the speed or time restrictions placed on EDC by the DCT and DECT specifications creates unique problems.

Several error detection and correction (EDC) schemes have been devised, particularly for determining whether data retrieved from a memory is identical to the data originally stored in memory and for correcting the retrieved data if it is not identical to the originally stored data. One common technique for assuring data integrity is the use of error correcting codes.

Generally, before data is written into a memory, it is passed through a logic network where the individual bits of a data word are combined in some predetermined manner to produce a series of check bits. The check bits are stored in memory in association with the data bits. When data is read or retrieved from memory, it is passed through the same logic network and new check bits are generated. The new check bits are then compared to the previously stored check bits. If an error in reading data has occurred the new check bits will not match the original check bits. The result of comparing new with original check bits is referred to as the syndrome. If sufficient check bits have been generated, then, it is possible to correct the data. The particular error correcting code chosen will determine: the type or design of the logic network utilized; the way in which data is applied to that network; and the extent to which corrections can be made.

It will be appreciated that for digital cordless telephones, voice data will not be stored or retrieved from memory, but rather, voice data will be either transmitted or received. Consequently, if error detection and correction is to occur, check bits associated with such voice data will have to be generated and transmitted with the voice data. Similarly, received voice data will have previously determined check bits concurrently received.

In the Japanese DCT system, a 16-bit Cyclic Redundancy Code (CRC) is specified. To this end, the Japanese DCT standard for transmission of data requires data to be transmitted in a particular format. Each transmission frame, i.e., each transmit slot described above, will first include channel indication and control data fields, followed by the actual voice or information data field, followed by a 16-bit CRC field.

Although, CRC has been used in the past for error detection, it is desirable to use CRC in cordless telephones for error correction as well.

Accordingly, a need exists for a digital cordless telephone system that utilizes a block code for error detection and correction. A particular need exists for a digital cordless telephone that utilizes CRC for both error detection and correction.

SUMMARY OF THE INVENTION

The previously described problems are overcome and the objects and advantages of the invention are achieved in an apparatus and method for digital cordless telephone systems. In accordance with the invention, methods and apparatus for detecting and correcting errors in received signals are provided. Such methods and apparatus include providing a table of predetermined syndromes, wherein each of the predetermined syndromes has an associated error correction pattern. The table is formed by selecting from all possible syndromes that could be predetermined from the segment length of received digital data, those predetermined syndromes having error patterns for correcting errors within the segment, wherein the number of errors is defined by an error parameter, and arranging the predetermined syndromes in the table in accordance with a predetermined order, such as ascending or descending numerical order. Thereafter, a current syndrome is calculated for the received digital data and the predetermined syndrome contained in the table matching the current syndrome is located by using a predetermined search technique. Received digital data is corrected by retrieving the error correction pattern associated with the located predetermined syndrome and correcting the error in the received digital data in response to this error correction pattern. In DCT the chosen error parameter is one.

Where the segment includes a number of bits, the step of selecting from all possible syndromes includes selecting only those syndromes having one bit error correction patterns associated therewith.

In a preferred embodiment, the block code used is a cyclic redundancy code and the search technique used is a binary search technique.

It is also preferred for the table of predetermined syndromes to actually include two tables, wherein the first table is provided by selecting from all possible syndromes that could be predetermined from the segment length those predetermined syndromes having error correction patterns for correcting a single error within the segment and arranging said predetermined syndromes in the first table in accordance with a predetermined order and the second table is provided by selecting those bit correction patterns associated with the syndromes selected for the first table. In such an embodiment it is further preferred for the second table to be arranged so that each of said bit correction patterns and its corresponding syndrome in said first table have the same address.

In order to correct received digital data it is necessary to retrieve the error pattern associated with the matching predetermined syndrome and correct the error in the digital data in response to the bit correction pattern.

In a digital cordless telephone system, wherein a voice signal is provided for transmission and a received signal is acquired via an antenna, the invention includes a base stage for converting the voice signal into a digit, al signal of a desired form, for correcting the received signal for bit errors and for converting the corrected received signal into a voice signal. In such a system an intermediate frequency stage is also provided for converting the digital signal into an analog transmission signal and for modifying the frequency of the transmission signal, wherein during transmission the frequency of the transmission signal is up converted to an intermediate frequency and wherein during reception the received signal is down converted from the intermediate frequency to a lower frequency. It is also desirable to provide a radio frequency stage for up converting during transmission the frequency of the transmission signal from said intermediate frequency to a desired radio frequency and for down converting during reception the received signal from a desired radio frequency to an intermediate frequency. It may further be desirable to provide an amplifier stage, including transmission and receive paths, for amplifying the transmission signal during transmission and for switching the antenna between said transmit and receive paths. In a preferred embodiment, the received signal is corrected using a cyclic redundancy code technique.

BRIEF DESCRIPTION OF THE DRAWINGS

The present invention will be better understood, and its numerous objects and advantages will become apparent by reference to the following detailed description of the invention when taken in conjunction with the following drawings, in which.

DETAILED DESCRIPTION

Figure 1:
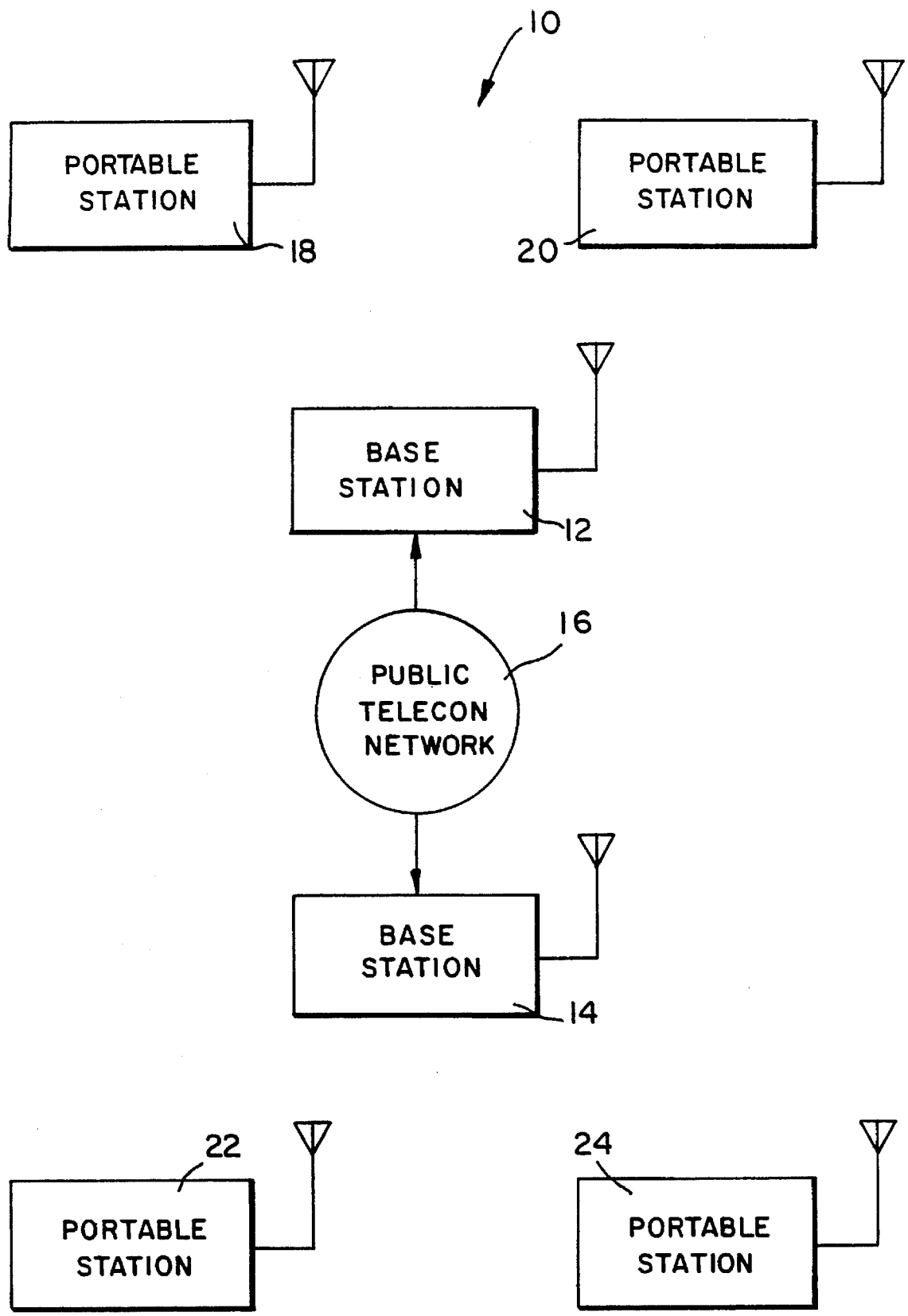
FIG. 1 is a block diagram of a digital cordless telephone system constructed in accordance with the present invention.

A DCT system constructed in accordance with the present invention is shown in FIG. 1 and generally designated 10. DCT system 10 is shown to include two base stations 12 and 14, each of which are adapted for connection to public telecommunications network 16. Portable stations 18 and 20, associated with base station 12, and portable stations 22 and 24, associated with base station 14, provide two-way cordless communication, i.e. a person using portable station 18 can have a conversation with a person using portable station 24. It is noted that the portable stations 18 through 24 are preferably in the form of a battery-operated handset.

It will be appreciated that base station 12 and portable stations or handsets 18 and 20 may be physically located several miles from base station 14 and portable stations 22 and 24. The distance between base stations is only limited by the capabilities of network 16. Although the invention may be useful in portable stations capable of transmitting signals over several miles, it is described herein in terms of units adapted for transmitting signals within a minimum range of 100 feet between base station and portable station. Additionally, although the present invention may be useful in portable stations which are capable of communicating directly with other portable stations, the invention is described herein in terms of the portable stations engaging in two-way communication via their associated base stations.

The invention will be described herein in terms of its use in the Japanese Personal Hand-Phone (PHP) system specification described previously. It will be recalled that the Japanese standard specifies the use of a plurality of individual carrier signals having a frequency separation of at least 300 kHz within an overall system bandwidth of about 23 MHz between approximately 1,895 MHz to 1,918 MHz. Each carrier signal should support four channels in a TDD format employing time division duplex for two-way communication.

Figure 2:
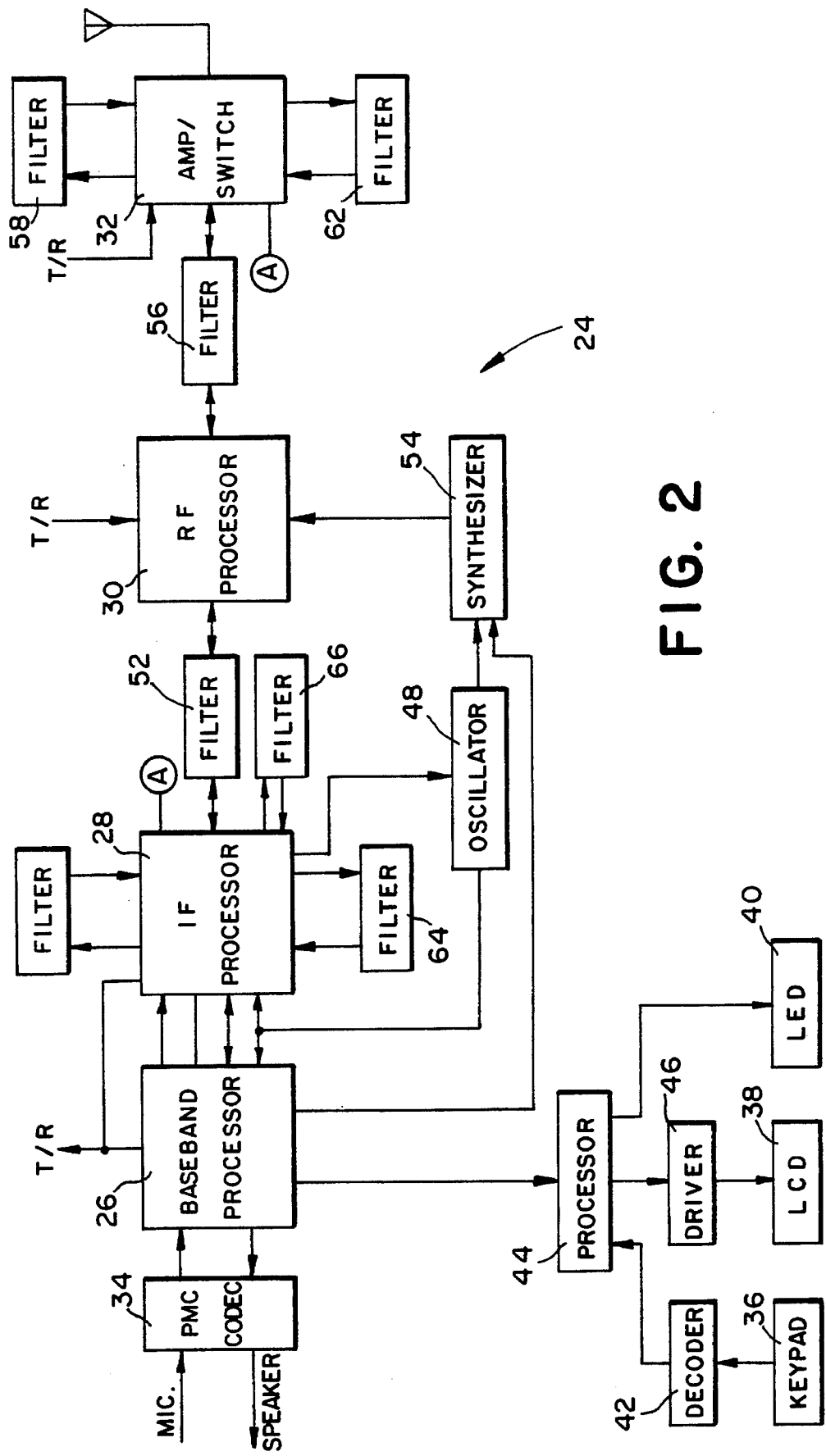
FIG. 2 is block diagram of the core components of a portable station depicted in FIG. 1.

It is noted that the internal structure of handsets 18 through 24 are identical, i.e. only the frequencies or time slots at which these handsets transmit and receive will be different. Consequently, only the internal structure of portable station 24 will be described. Such internal structure is generally depicted in FIG. 2.

The core of portable station 24 is an integrated circuit chip set including chips or processors 26, 28, 30 and 32. Before giving a detailed description of the structure of each chip, consider generally the operation of processors 26 through 32 during a transmit and receive operation. During transmission, base band processor 26 receives a voice signal and operates to convert the voice signal into a digital signal having a desired form, i.e., a differential $\pi/4$-QPSK signal. At this point the digital signal includes check bits for performing error detection and correction upon reception of the signal. The digital signal is provided to intermediate frequency (IF) processor 28 which converts the digital signal into an analog signal and modifies the frequency of the analog signal upward to an intermediate frequency. The intermediate frequency signal is provided to radio frequency (RF) processor 30. RF processor 30 further modifies the frequency of the carrier signal upward to the radio frequency desired for transmission. The radio frequency signal is provided to amp/switch chip 32. During transmission, chip 32 amplifies the radio frequency signal and provides that amplified signal to an antenna for transmission to base station 14.

During reception, a signal received at the antenna is provided to IC 32 which passes the received signal to RF processor 30. RF processor 30 down converts or heterodynes the receive signal to an intermediate frequency signal, preferably the same intermediate frequency used during transmission. The intermediate frequency signal is provided to IF processor 28. IF processor 28 further down converts the frequency of the intermediate frequency signal, preferably a two step or dual down conversion, and generates a digital signal representative of the down converted received signal. The digital signal generated by IF processor 28 is provided to base band processor 26 for conversion into a voice signal.

Consider now a transmit operation of portable station 24 in greater detail. A microphone (not shown) provides an analog voice signal to pulse code modulation (PCM) codec 34. Codec 34 converts the analog voice signal into a pulse code modulated signal. Codec 34 can be any known device for converting analog voice signals into PCM signals. The PCM signal is provided to base band processor 26. It is noted that various peripheral devices are utilized in order to enable the transmit operation. In particular, keypad 36, liquid crystal display (LCD) 38 and light emitting diodes (LED) 40 are used to initiate transmission. Keypad 36 is operative through decoder 42 to provide appropriate dialing or keying signals to processor 44. Processor 44 in turn operates LCD 38 through driver 46 and is shown to enable LED 40 directly. Processor 44 in turn interacts directly with base band processor 26. A master oscillator 48 provides a master clock signal to processors 26 and 28. In the preferred embodiment, the frequency of the master clock signal is 19.2 MHz.

Processor 26 converts the PCM signal to a digital signal using an ADPCM technique. The ADPCM signal is divided into frames, wherein each frame includes a predetermined number of bits. In accordance with the invention, Processor 26 generates check bits for error detection and correction for each frame of ADPCM bits.

In the preferred embodiment, the resulting digital signal has a repetition rate of approximately 1.152 MHz. Processor 26 interpolates the digital signal at an effective sampling rate of 9.6 MHz. The output of base band processor 26 is a series of digital samples representative of a modulated carrier signal having a frequency of 10.752 MHz. The samples are provided to IF processor 28. IF processor 28 converts the samples into an analog IF carrier in an internal digital-to-analog converter and thereafter filters the analog signal through bandpass filter 50. The filtered signal is provided back to IF processor 28 whereupon it is mixed with a local oscillator signal having a frequency of 259.2 MHz. The resulting signal, having a frequency of 248.448 MHz is thereafter passed through bandpass filter 52.

The output of band pass 52 is provided to RF processor 30 whereupon it is again mixed with a signal having a particular frequency. The object of this final mixing operation is to fix the frequency of the signal to be transmitted at the frequency of a desired channel. The reference signal which is utilized in this final mixing step is generated by synthesizer 54. It will be recalled that this reference frequency is a multiple of 300 kHz. It is noted that 300 kHz is chosen in relation to the channel spacing requirements. After this final mixing stage, a signal having a frequency in the range between 1,895 MHz to 1,918 MHz, is passed through bandpass filter 56 to amplifier/switch IC 32. During a transmit operation, IC 32 passes the signal received from filter 56 through an internal amplifier, the output of which is connected to filter 58. After passing through filter 58, the signal to be transmitted is provided back to chip 32 where it is connected to antenna 60 for transmission. It is noted that the switching of processors 28, 30 and 32 between transmit and receive operations is controlled by a T/R control signal generated by processor 26.

Consider now the structure of portable station 24 during a receive operation. Base band processor 26 generates an appropriate receive control signal which is applied to processors 28, 30 and 32. Upon receipt of this signal, IC 32 switches antenna 60 into a receive path, whereupon the signal from antenna 60 is passed through filter 62 back into IC 32 and provided to bandpass filter 56. Bandpass filter 56 is thus shared for both transmission and reception operations.

The output of band pass filter 56 is provided to RF processor 30. The receive signal is mixed in RF processor 30 with a signal generated by synthesizer 54 so that the desired carrier frequency is selected as a result of the heterodyne operation. The frequency of the signal generated by synthesizer 54 is such that the selected carrier is output from RF processor 30 at a frequency of approximately 248.448 MHz. The selected carrier output from RF processor 30 is passed through bandpass filter 52 and provided to IF processor 28. Bandpass filter 52 is thus also shared for both transmission and reception operations.

IF processor 28, through a mixing operation, reduces the frequency of the selected carrier to approximately 10.75 MHz. This signal is thereafter passed through bandpass filter 50. In an especially preferred embodiment, a separate bandpass filter (not shown) is utilized for filtering the receive signal at this point. The selected carrier signal is thereafter subjected to a further mixing operation in order to reduce the carrier frequency to 1.15 MHz. The resulting 1.15 MHz signal is passed through bandpass filter 64 and back to IF processor 28.

At this point, IF processor 28, preferably via a limiting-interpolation operation, generates a digital signal representative of the selected carrier signal which is still in an analog form. The digital signal generated by IF processor 28 is provided to base band processor 26 whereupon it is demodulated, processed for error detection and correction and thereafter converted into a PCM signal and provided to codec 34. Codec 34 thereafter converts the PCM signal into an analog signal which is provided to a speaker (not shown) for reproduction.

Figure 3:
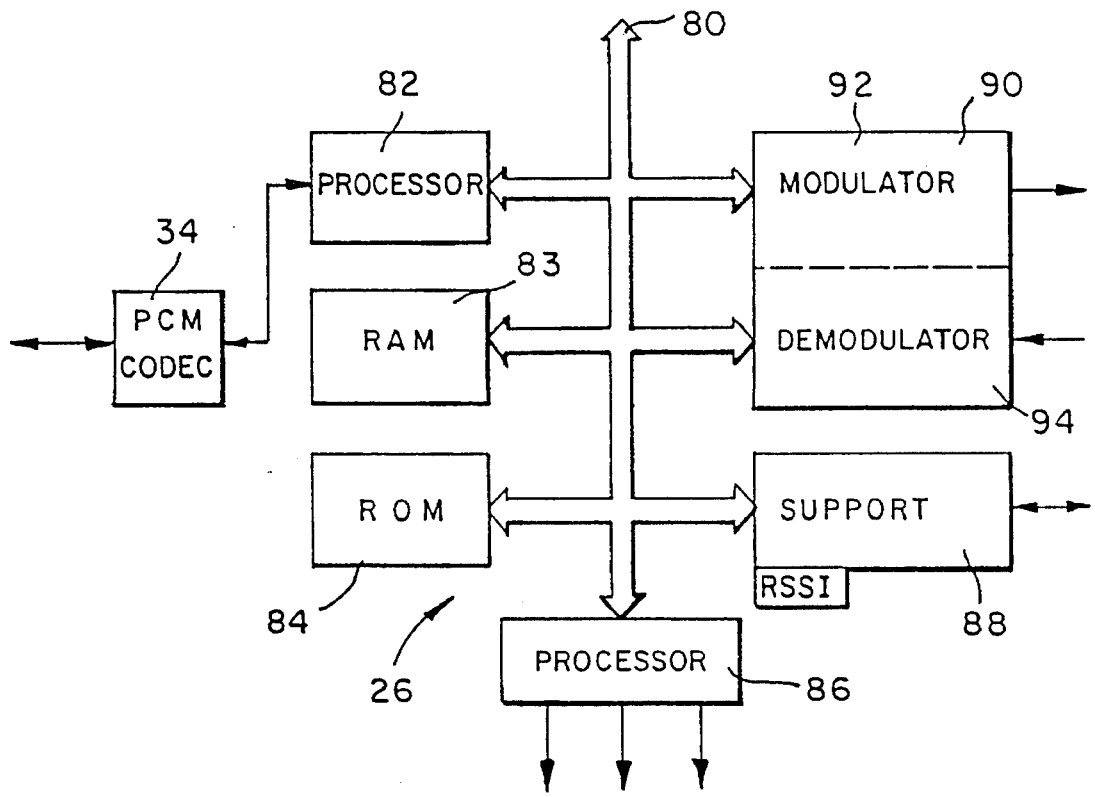
FIG. 3 is a generalized schematic showing the operation of the base band processor depicted in FIG. 2.

FIG. 3 generally discloses the internal operation of base band processor 26. Processor 26 is shown to include a central bus 80 which interconnects all of the various components of processor 26. Processor 82 is connected to bus 80 and is primarily responsible for adaptive pulse code modulation or adaptive pulse code demodulation, depending on whether a transmit or receive operation is being carried out on. Programming for processor 26 is contained in read-only memory 84. In the preferred embodiment of the invention, error detection and correction based on cyclic redundancy code information for received signals is accomplished by processor 26 using the programming stored in memory 84 together with the memory available in random access memory 83. Similarly the generation of CRC information, i.e. check bits, for information to be transmitted is also preferably generated by processor 26 using memory 83 for temporary storage. An interface processor 86 is provided for interfacing processor 26 with the various peripheral devices, i.e., keypad 36, LCD 38 and LED 40.

A support device 88 is provided for the transmission and reception of various control signals such as the T/R signal. A modem 90 is provided for the demodulation of received signals and for the modulation of signals to be transmitted. To this end, modem 90 includes a modulator 92 and a demodulator 94. Modem 90 controls both the provision of signals to IF processor 28 and the reception of signals from processor 28. It will be recalled that the digital signal received by demodulator 94 is representative of the analog signal received at antenna 60.

Modulator 92 is connected to bus 80 and is responsible for producing a series of digital samples of a modulated carrier having a frequency of 10.752 MHz, referred to previously. The samples generated by modulator 92 are output from modem 90 to IF processor 28. Modem 90 is controlled in a fashion that digital samples generated by modulator 92 are only transmitted during prescribed time periods. During all other time periods, modem 90 prevents the transmission of digital samples to processor 28.

Consider now the error detection and correction operation of the invention. The Japanese specification for DCT calls for the use of a Cyclic Redundancy Code (CRC) scheme for error detection. Although the invention will be described in terms of this code, it is not so limited. The invention will find usefulness with any form of block code.

As indicated previously, during transmission, information from PCM codec 34 is converted into a digital signal using an ADPCM technique. The ADPCM digital signal is divided into frames, wherein each frame will include a prescribed number of bits representative of voice data. Prior to transmission, other digital information is added to the frame such as a preamble, a unique word and check bits. As will be described in greater detail below, processor 26 generates the check bits or block code to accompany each block or frame of data to be transmitted.

In the preferred embodiment a 16-bit CRC is generated by processor 26 for each frame. Any known technique for generating CRC data can be used, so long as the transmission time constraints can be met. Indeed, the generation of code information, i.e., check bits, for transmission with voice data is not considered part of the invention. Rather, the invention relates to operations performed upon receipt of a transmitted signal to detect and correct errors in the received information.

Although CRC has been proposed only for error detection in DCT applications, the invention also uses CRC for error correction. CRC is a block code with a minimum Hamming distance of 4 in the DCT application. It has the potential to be used for error correction as well as error detection in received signals. Similar to transmission procedures, processor 26 performs error detection and correction on a frame by frame basis by first calculating the CRC or code word for each received frame. Processor 26 then determines a syndrome in relation to a comparison between the calculated CRC and the CRC present in the received frame. Next processor 26 determines the frame correction associated with the determined syndrome and thereafter corrects the received frame. Consider now the EDC operations of processor 26 in more detail.

Regardless of whether processor 26 is engaged in transmission or reception, the first EDC procedure is the generation or calculation of the check bits. Again for purposes of explanation the EDC procedure is explained in terms of CRC. However, it is noted that the invention will find applicability with any block code.

The CRC is calculated for each frame or burst of data to be transmitted or which is received. For both transmission and reception the CRC calculation procedure is the same. It is noted that a variety of efficient calculation methods may be used to calculate the CRC depending on the available memory space and processor loading. The scope of the invention is not limited to the particular method discussed below.

It will be appreciated that minimizing processor loading is desirable if processor speed and efficiency are important considerations. In DCT applications reduction in processor loading is desirable. The present invention minimizes loading in the CRC calculation by providing a look-up table approach, thereby taking advantage of two properties of cyclic block codes, namely that the modulo-2 sum of any two code words is a codeword and that any cyclic shift (rotation) of a codeword is also a codeword.

Each frame of digital data, whether transmitted or received, is divided into multiple 8-bit bytes. A look-up table is provided which contains the 16-bit CRC for each of the 256 possible 8-bit bytes. The CRC is calculated by looking up the CRC for the first byte to form a valid CRC codeword. The calculation continues by forming another CRC codeword from the second data byte exclusively ORed (XORed) with the most significant byte of the first CRC. The two remaining codewords are then added together to form a new codeword. The new codeword has the following form, the first data byte is in the first 8-bit position, the second data byte is in the second 8-bit position and the 16-bit CRC for these two bytes is in the third and fourth 8-bit positions. This process continues until all bytes have been processed. It is noted that it is not necessary to actually add the codewords together. Rather the CRC is kept as a running sum. When all bytes have been processed, the CRC running sum is simply appended to the string of bytes to form a complete codeword. If processor 26 is in the transmit mode, the byte string and appended CRC are provided to modulator 92 for further processing. If processor 26 is in the receive mode, the received data is now checked for errors.

Figure 4:
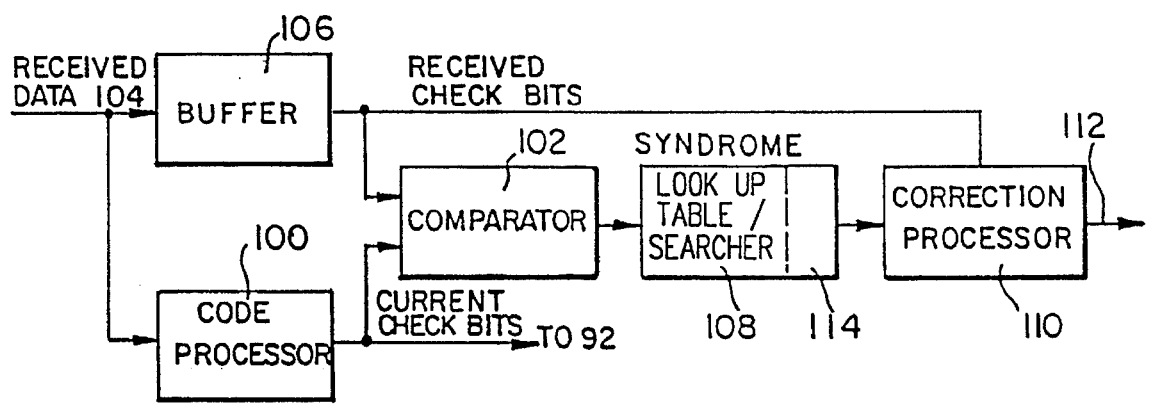
FIG. 4 is a block diagram of error detection and correction apparatus constructed in accordance with the present invention.

Referring now to FIG. 4, there is shown the structure for performing EDC in the accordance with the present invention. The procedure described above for calculating the CRC is all achieved in code processor 100. If processor 26 is in the transmit mode the complete codeword formed in code processor 100 is output to modulator 92. If processor 26 is in the receive mode, the CRC is provided to comparator 102 for further processing.

As shown in FIG. 4, during a receive operation, received frames are provided at 104 to buffer 106 and code processor 100. The CRC or check bits calculated in code processor 100 are compared or combined in comparator 102 to the received CRC or check bits, in any known manner, e.g., XORed, to form a syndrome. The syndrome is searched in look-up table 108 to find the matching syndrome. If a match is found, the correction bit pattern associated with the matched syndrome is provided to a correction processor 110. Processor 110 also receives the original frame from buffer 106. Processor 110 combines by any suitable technique, e.g., XORs, the original frame with the correction bit pattern and outputs the corrected frame at 112.

In accordance with the invention, error correction is accomplished using look-up table 108. It will be appreciated that a 16-bit CRC will result in a 16-bit syndrome, requiring approximately 64,000 syndrome look-up table entries. Such a look-up procedure is not feasible, in relation to the time available, in a DCT application. The number of entries required is reduced in the preferred embodiment by limiting error correction to a predetermined number of errors, such predetermined number defining an error parameter. By incorporating such a limitation the number of entries in a look-up table is reduced. In the DCT embodiment described herein, the error parameter is predetermined at one. Consequently, the look-up table is reduced to only a number of entries equal to the number of bits present in the field where error correction is to be performed.

For example, in the DCT application described above, each frame or burst will include a 196-bit field in which voice data or other information will be placed. By setting the error parameter equal to one, i.e., by limiting error correction to single bit entries, the look-up table is reduced to 196 entries, one entry for each bit in the field. Each entry in the look-up table represents a syndrome and the bit string or bit correction pattern necessary to make a single bit change in the desired location. Unfortunately, even with such a reduction in syndrome possibilities, i.e., from 64,000 to 196, the time necessary to perform an entry by entry search in the look-up table is still prohibitive.

In accordance with a further aspect of the invention, the time required to look-up a given syndrome can be further reduced by pre-arranging the order of entries in the look-up table and using a search strategy associated with such a prearrangement. It will be appreciated given the parameter of a 16-bit CRC and the limitation of correcting only single bit errors that all possible syndromes can be determined in advance. The determined syndromes, which can be viewed as numbers in the base 2 form, are arranged in a specific order, such as ascending or descending numerical (base 2) order, within the look-up table. With the syndromes so arranged a binary search can be performed in the look-up table to locate the matching syndrome.

The binary search starts in the middle of the look-up table. Since the syndromes are arranged in numerical order, one need only compare the numerical value (base 2) of the syndrome, or the bit position of the highest 1, in order to determine whether the first half or the second half of the table need be searched. If the first half is to be searched, the search begins in the middle of the first half. Again a determination is made to determine whether the numerical value of the syndrome will be found in the first quarter or second quarter of the table. By continuing this binary search process, the location of the syndrome is narrowed and the actual matching syndrome can be quickly found. Once found the correction bit pattern associated with that syndrome is output to correction processor 110.

It is noted that the above procedure requires that each entry of the look-up table have a syndrome and an associated bit correction pattern, i.e., a series of 0s with a 1 in the bit position where correction is to occur. It is also possible to provide two tables, one containing syndromes and one containing bit correction patterns. In such an embodiment, the matching syndrome would have associated with it the index or address for locating the specific bit correction pattern for that syndrome in the second table. Such an arrangement is shown in FIG. 4 by the dashed line defining second table 114. In such an embodiment it is especially preferred for the first and second look-up tables to be memories having identical address locations. By matching the syndrome generated by comparator 102 to a syndrome contained in memory 108, the index or address of the matched syndrome would also be the index or address of the associated bit correction pattern in memory 114.

While the invention has been described and illustrated with reference to specific embodiments, those skilled in the art will recognize that modifications and variations may be made without departing from the principles of the invention as described hereinabove and set forth in the following claims.

What is claimed is:

1. A method for determining the error pattern necessary to correct bit errors present in a segment of digital data, wherein said segment has a segment length, said data being encoded using a block code, said method comprising the steps of:

providing a table of predetermined syndromes, each of said predetermined syndromes having an associated error correction pattern, wherein said table is formed by selecting from all possible syndromes that could be predetermined from said segment length those predetermined syndromes having error patterns for correcting a predetermined number of errors within said segment and arranging said predetermined syndromes in said table in accordance with a predetermined order, the predetermined order being one of an ascending and a descending numerical order;

calculating a current syndrome for said digital data; and locating the predetermined syndrome contained in said table matching said current syndrome by using a predetermined search technique.

2. The method of claim 1, wherein said segment is comprised of a number of bits and wherein said step of selecting from all possible syndromes comprises selecting only those syndromes having one bit error patterns associated therewith.

3. The method of claim 1, wherein said predetermined order is ascending numerical order.

4. The method of claim 1, wherein said predetermined order is descending numerical order.

5. The method of claim 1, wherein said block code is a cyclic redundancy code.

6. The method of claim 1, wherein said predetermined search technique is a binary search technique.

7. The method of claim 1, wherein said predetermined number of errors is equal to one.

8. The method of claim 1, wherein said step of providing a table of predetermined syndromes, each of said predetermined syndromes having an associated error correction pattern comprises the step of providing first and second tables, wherein said first table is provided by selecting from all possible syndromes that could be predetermined from said segment length those predetermined syndromes having error patterns for correcting a predetermined number of errors within said segment and arranging said predetermined syndromes in said first table in accordance with a predetermined order and said second table is provided by selecting those bit correction patterns associated with the syndromes selected for said first table.

9. The method of claim 8, wherein the step of providing said second table comprises the step of arranging said bit correction patterns in said second table so that each of said bit correction patterns and its corresponding syndrome in said first table have the same address.

10. A method for correcting a single bit error present in a segment of digital data, said data being encoded using a block code, wherein said block code generates check bits associated with said digital data, said method comprising the steps of:

providing a table of predetermined syndromes, each of said predetermined syndromes having an associated error pattern, wherein said table is formed by selecting from all possible syndromes that could be predetermined from said digital data those predetermined syndromes having error patterns for correcting single bit errors and wherein said predetermined syndromes are arranged in said table in accordance with a predetermined order;

calculating a current syndrome for said digital data;

locating the predetermined syndrome contained in said table matching the current syndrome by using a binary search technique;

retrieving the error pattern associated with said predetermined syndrome; and correcting the error in said digital data in response to said error pattern.

11. The method of claim 10, wherein said step of calculating a current syndrome for said digital data comprises the steps of calculating current check bits for said segment and comparing said current check bits with the check bits associated with said digital data and generating a syndrome in relation to said comparison.

12. Apparatus for determining the error pattern necessary to correct bit errors present in a segment of digital data, wherein said segment has a segment length, said data being encoded using a block code, said apparatus comprising:

a table of predetermined syndromes, each of said predetermined syndromes having an associated error correction pattern, wherein said table is formed by selecting from all possible syndromes that could be predetermined from said segment length those predetermined syndromes having error patterns for correcting a predetermined number of errors within said segment and arranging said predetermined syndromes in said table in accordance with a predetermined order, the predetermined order being one of an ascending and a descending numerical order;

a processor for calculating a current syndrome for said digital data; and locating means for locating the predetermined syndrome contained in said table matching said current syndrome by using a predetermined search technique.

13. The apparatus of claim 12, wherein said segment is comprised of a number of bits and said table is formed by selecting only those syndromes having one bit error patterns associated therewith.

14. The apparatus of claim 12, wherein said predetermined order is ascending numerical order.

15. The apparatus of claim 12, wherein said predetermined order is descending numerical order.

16. The apparatus of claim 12, wherein said block code is a cyclic redundancy code.

17. The apparatus of claim 12, wherein said predetermined search technique is a binary search technique.

18. The apparatus of claim 12, wherein said predetermined number of errors is equal to one.

19. The apparatus of claim 12, wherein table of predetermined syndromes comprises first and second tables, wherein said first table is formed by selecting from all possible syndromes that could be predetermined from said segment length those predetermined syndromes having error patterns for correcting a predetermined number of errors within said segment and arranging said predetermined syndromes in said first table in accordance with a predetermined order and said second table is formed by selecting those bit correction patterns associated with the syndromes selected for said first table.

20. The apparatus of claim 19, wherein said second table comprises said bit correction patterns being arranged in said second table so that each of said bit correction patterns and its corresponding syndrome in said first table have the same address.

21. Apparatus for correcting bit errors present in a segment of digital data, said data being encoded using a block code, wherein said block code generates check bits, said apparatus comprising:

a table of predetermined syndromes, each of said predetermined syndromes having an associated error pattern, wherein said table is formed by selecting from all possible syndromes that could be predetermined from said digital data those predetermined syndromes having error patterns for correcting single bit errors and wherein said predetermined syndromes are arranged in said table in accordance with a predetermined order;

a processor for calculating current check bits associated with said segment;

a comparator for comparing said current check bits with the check bits associated with said segment and for generating a current syndrome for said digital data;

retrieval means for locating the predetermined syndrome contained in said table matching the current syndrome by using a binary search technique and retrieving the bit correction pattern associated with the located predetermined syndrome; and a correction processor for correcting the error in said digital data in response to the retrieved bit correction pattern.

22. The apparatus of claim 21, further comprising a buffer for storage of said segment of digital data.

23. A digital cordless telephone system, wherein a voice signal is provided for transmission and a received signal is acquired via an antenna, said system comprising:

a base stage, connected to receive said voice signal, for converting said voice signal into a digital signal of a desired form, for correcting said received signal for bit errors and for converting said corrected received signal into a voice signal;

an intermediate frequency stage, connected to said base stage, for converting said digital signal into an analog transmission signal and for modifying the frequency of said transmission signal, wherein during transmission the frequency of said transmission signal is up converted to an intermediate frequency and wherein during reception said received signal is down converted from said intermediate frequency to a lower frequency;

a radio frequency stage, connected to said intermediate frequency stage, for up converting during transmission the frequency of said transmission signal from said intermediate frequency to a desired radio frequency and for down converting during reception said received signal from a desired radio frequency to said intermediate frequency; and an amplifier/switch stage, connected between said radio frequency stage and said antenna, said amplifier/switch stage comprising transmission and receive paths, for amplifying said transmission signal during transmission and for switching said antenna between said transmit and receive paths, wherein said base stage comprises apparatus for correcting bit errors present in a segment of digital data, said data being encoded using a block code, wherein said block code generates check bits, said apparatus comprising:

a table of predetermined syndromes, each of said predetermined syndromes having an associated error pattern, wherein said table is formed by selecting from all possible syndromes that could be predetermined from said digital data those predetermined syndromes having error patterns for correcting a predetermined number of bit errors and wherein said predetermined syndromes are arranged in said table in accordance with a predetermined order, a processor for calculating current check bits associated with said segment, a comparator for comparing said current check bits with the check bits associated with said segment and for generating a current syndrome for said digital data, retrieval means for locating the predetermined syndrome contained in said table matching the current syndrome by using a binary search technique and retrieving the bit correction pattern associated with the located predetermined syndrome, and a correction processor for correcting the error in said digital data in response to the retrieved bit correction pattern.

* * * * *